United States Patent [19]

Einzinger et al.

[11] Patent Number: 4,691,129
[45] Date of Patent: Sep. 1, 1987

[54] DRIVE CIRCUIT FOR A POWER MOSFET WITH SOURCE-SIDE LOAD

[75] Inventors: Josef Einzinger, Unterschleissheim; Christine Fellinger, Unterhaching; Ludwig Leipold, Munich; Jenoë Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 886,578

[22] Filed: Jul. 16, 1986

[30] Foreign Application Priority Data

Mar. 19, 1986 [DE] Fed. Rep. of Germany ....... 3609236

[51] Int. Cl.$^4$ ......................................... H03K 17/687; H03K 3/01; H02H 7/00; G05F 1/40
[52] U.S. Cl. .................................... 307/581; 307/574; 307/270; 307/200 B; 361/18; 323/284
[58] Field of Search ............... 307/571, 574, 575, 577, 307/581, 584, 304, 296 A, 270, 200 B; 361/18; 323/284, 289

[56] References Cited

U.S. PATENT DOCUMENTS 4,086,642  4/1978  Yoshida et al. ..................... 307/304
4,511,815  4/1985  Wood ................................. 307/584

FOREIGN PATENT DOCUMENTS 0082422   6/1983  European Pat. Off. ............ 307/584
0163302  12/1985  European Pat. Off. ............ 307/270

OTHER PUBLICATIONS

Krausse et al., "Power MOSFETs Run Directly Off TTL", Aug. 28, 1980, pp. 146-147.

Primary Examiner—Stanley D. Miller
Assistant Examiner—Trong Quang Phan
Attorney, Agent, or Firm—Lawrence C. Edelman

[57] ABSTRACT

When a power MOSFET operated as a source follower is driven by an electronic switch, an interruption of the connection between ground and the electronic switch may result in the output potential of the electronic switch to change so that the power MOSFET is partially switched on. This causes a considerable amount of power dissipation. Therefore, there is placed between the source and gate electrodes of the MOSFET a depletion MOSFET whose gate is connected to the terminal of the electronic switch intended for connection to ground. Thus, the power MOSFET remains non-conducting upon interruption of the connection between the electronic switch and ground.

2 Claims, 1 Drawing Figure

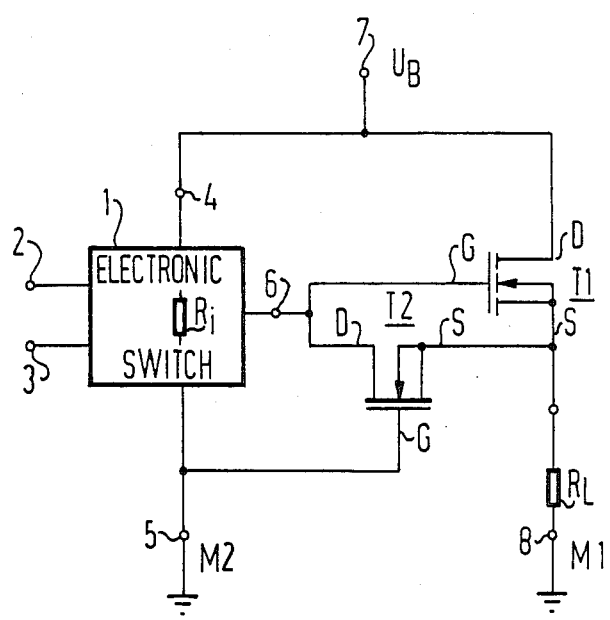

DRIVE CIRCUIT FOR A POWER MOSFET WITH SOURCE-SIDE LOAD

BACKGROUND OF THE INVENTION

1. Field of the Invention

The invention relates to a drive circuit for a power MOSFET having a load connected between its source electrode and ground potential and an electronic switch connected between its gate electrode and ground potential.

2. Description of the Prior Art

Such a drive circuit has been described, for example, in the German journal "Elektronik Industrie" 4-1985, pages 32 to 38. It comprises a plurality of electronic components which carry out logic operations and switching functions. The output of the electronic switch is connected to the gate electrode of a power MOSFET and the source electrode of the power MOSFET is in series with a load. The side of the load remote from the MOSFET is grounded. The electronic switch itself is also grounded.

In many cases, e.g. in the electric systems of motor vehicles, the ground terminal to which the electronic switch is connected is not identical with the ground terminal to which the load is connected. Now, if due to vibrations or corrosion for example, an interruption occurs between ground potential and the terminal of the electronic switch intended for connection to ground potential, the output potential of the switch changes. In turn, the gate potential of the power MOSFET will change and it may be partially switched on. A considerable power dissipation will then occur in the power MOSFET.

SUMMARY OF INVENTION

It is an object of the invention to develop a drive circuit of the above mentioned type in which partial switching on of the power MOSFET upon interruption of the connection between the electronic switch and ground potential is avoided.

In accordance with the invention, this problem is solved by connecting the source-drain path of a depletion mode MOSFET between the source and gate electrodes of the power MOSFET, and connecting the gate electrode of the depletion mode MOSFET to a terminal of the electronic switch which is intended for connection to ground potential.

Other features and advantages of the invention will be apparent from the following description of the preferred embodiment, and from the claims.

For a fuller understanding of the present invention, reference should now be made to the detailed description of preferred embodiment of the invention and to accompanying drawing.

BRIEF DESCRIPTION OF THE DRAWING

The sole FIGURE illustrates a drive circuit for a power MOSFET which is constructed in accordance with the principles of the invention.

DETAILED DESCRIPTION OF THE DRAWING

In the FIGURE, a power MOSFET T1 is illustrated which has a load $R_L$ connected in series on its source side. The drain electrode D of MOSFET T1 is connected to a terminal 7 and the load connection remote from MOSFET T1 is connected to a terminal 8. Terminal 8 is at ground potential M1. A supply voltage, for example a battery voltage $U_B$, is applied between terminals 7 and 8.

The drive circuit for MOSFET T1 comprises an electronic switch 1 with several input terminals. For simplicity only two input terminals are shown and are marked 2 and 3. Electronic switch 1 contains semiconductor components, the exact design and interconnection of which are not essential. The aggregate of the electronic components is therefore symbolized by an internal resistance $R_i$. Electronic switch 1 has two power input terminals 4, 5, the supply voltage $U_B$ being applied to terminal 4, ground potential M2 being connected to terminal 5. Ground potentials M1 and M2 are formed, for example, from different points of the body of a motor vehicle. Electronic switch 1 has an output terminal 6 at which, dependent upon signals at input terminals 2 and 3, an output voltage occurs. Output terminal 6 is connected to gate electrode G of MOSFET T1. The voltage occurring at output terminal 6 serves to switch power MOSFET T1 on.

Between source S and gate G electrodes of MOSFET T1 lies the source-drain path of a depletion mode MOSFET T2. The latter has a gate electrode G which is connected to terminal 5 of electronic switch 1. Terminal 5 forms part of electronic switch 1.

To explain the operation of the circuit arrangement, we shall assume to begin with that electronic switch 1 is properly connected via its terminal 5 to ground M2 and that power MOSFET T1 does not conduct. Now, if at output terminal 6 a positive voltage appears, it is connected both to the drain electrode D of MOSFET T2 and to the gate electrode G of MOSFET T1. Since the source electrode of both transistors and the gate electrode G of MOSFET T2 is at ground potential, MOSFET T2 conducts. Depletion mode MOSFET T2 is dimensioned so that at $U_{GS}=0$ V it draws less current than electronic switch 1 supplies at its output terminal 6. Hence current flows into the gate-source capitance of MOSFET T1, and MOSFET T1 is switched on. When switched on, the source potential of both MOSFET's T1 and 2 increase in the direction of the battery voltage. Thereby, MOSFET T2 receives a negative gate-source bias and becomes non-conductive when the potential at its gate electrode G is lower by the starting voltage than the potential at its source electrode. The potential at terminal 6 now also increases and attains a value which is higher than the battery voltage $U_B$. This can be achieved by a specific design of electronic switch 1 as a charge pump, as described e.g. in the journal "Siemens Components", No. 4/84, pages 169 to 170 published by Siemens A. G., Hellabrunner Strasse 1 D-8000 Muenchen 80, Federal Republic of Germany.

If during the non-conductive state of MOSFET T1 the connection between terminal 5 and ground potential M2 is interrupted, the reference potential at terminal 5 of electronic switch 1 will, due to blocking currents of the electronic components contained in it, increase in the direction of the voltage $U_B$. Consequently, the potential at gate electrode G of MOSFET T2 will increase relative to its source electrode potential and MOSFET T2 will become fully conductive. The current occurring at output terminal 6 therefore drains only through T 2 and load $R_L$ toward ground M1. Thus, power MOSFET T1 cannot be switched on.

In an extreme case, the voltage between the gate and source electrodes, i.e. the semiconductor body, of T2 can become as high as operating voltage $U_B$. The gate insulation layer (gate oxide) must therefore have a thickness such that in this case a breakdown of the gate oxide does not occur. For a breakdown voltage of e.g. 100 V the gate oxide is given a thickness of 200 nm.

Thus, there has been shown and describe a novel apparatus for driving a power MOSFET which fulfills all the objects and advantages sought therefore. Many changes, modifications, variations and other uses and applications of the subject invention will, however, become apparent to those skilled in the art after considering this specification and he accompanying drawings which disclose a preferred embodiment thereof. All such changes, modifications, variations and other uses and applications which do not depart from the spirit and scope of the invention are deemend to be covered by the invention which is limited only by the claims which follow.

What is claimed is:

1. In a drive circuit for a power MOSFET having a load connected between the source electrode of said power MOSFET and ground potential and with an electronic switch connected between ground potential and the gate electrode of said power MOSFET, the improvement comprising:
   the source-drain path of a depletion mode MOSFET being connected between the source and gate electrodes of said power MOSFET; and
   the gate electrode of said depletion mode MOSFET being connected to a terminal of said electronic switch for connection to ground potential.

2. A circuit arrangement according to claim 1, wherein the breakdown voltage between the gate electrode and the source electrode of said depletion MOSFET is at least as high as the supply voltage.

* * * * *